(12) United States Patent
Chen

(10) Patent No.: US 9,087,901 B2
(45) Date of Patent: Jul. 21, 2015

(54) SEMICONDUCTOR DEVICE

(71) Applicant: SEMICONDUCTOR MANUFACTURING INTERNATIONAL (SHANGHAI) CORPORATION, Shanghai (CN)

(72) Inventor: Lele Chen, Shanghai (CN)

(73) Assignee: SEMICONDUCTER MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/571,561

(22) Filed: Dec. 16, 2014

(65) Prior Publication Data

US 2015/0097235 A1    Apr. 9, 2015

Related U.S. Application Data

(62) Division of application No. 13/935,228, filed on Jul. 3, 2013, now Pat. No. 8,962,428.

(30) Foreign Application Priority Data

Sep. 18, 2012  (CN) .......................... 2012 1 0349744

(51) Int. Cl.
*H01L 31/072* (2012.01)
*H01L 31/109* (2006.01)
*H01L 31/0328* (2006.01)
*H01L 31/0336* (2006.01)
*H01L 29/78* (2006.01)
*H01L 27/088* (2006.01)
*H01L 29/08* (2006.01)

(52) U.S. Cl.
CPC .......... *H01L 29/7848* (2013.01); *H01L 27/088* (2013.01); *H01L 29/086* (2013.01); *H01L 29/0869* (2013.01); *H01L 29/0878* (2013.01); *H01L 29/0886* (2013.01); *H01L 29/7816* (2013.01)

(58) Field of Classification Search
CPC .............. H01L 31/072; H01L 29/2003; H01L 29/66462; H01L 29/7787; H01L 29/7783; H01L 29/802
USPC ............ 257/57, 192, 288, 368; 438/285, 296, 438/301, 478

See application file for complete search history.

(56) References Cited

U.S. PATENT DOCUMENTS

| | | | |
|---|---|---|---|
| 8,853,060 B1 * | 10/2014 | Lai et al. ........................ | 438/478 |
| 2012/0058616 A1 * | 3/2012 | Ahn et al. ..................... | 438/285 |
| 2012/0309150 A1 | 12/2012 | Zhang | |
| 2012/0319120 A1 | 12/2012 | He et al. | |
| 2013/0113027 A1 * | 5/2013 | Chiang et al. ................. | 257/288 |
| 2014/0077279 A1 | 3/2014 | Tu | |
| 2014/0159052 A1 | 6/2014 | Liu et al. | |

* cited by examiner

*Primary Examiner* — Phuc Dang
(74) *Attorney, Agent, or Firm* — Innovation Counsel LLP

(57) ABSTRACT

A semiconductor device is disclosed. The device includes a plurality of gates formed on a surface of a substrate, a plurality of sidewalls formed on side surfaces of the gates, a Sigma-shaped recess formed in the substrate between adjacent gates, a SiGe seed layer formed on an inner surface of the Sigma-shaped recess, boron-doped bulk SiGe formed on a surface of the SiGe seed layer, with the boron-doped bulk SiGe filling the Sigma-shaped recess, and a boron-doped SiGe regeneration layer formed in a first recess beneath the surface of the substrate. The first recess is formed by etching a portion of the SiGe seed layer and the boron-doped bulk SiGe in the Sigma-shaped recess, and the boron-doped SiGe regeneration layer has a higher concentration of boron than the SiGe seed layer or the boron-doped bulk SiGe.

20 Claims, 6 Drawing Sheets

US 9,087,901 B2

SEMICONDUCTOR DEVICE

CROSS-REFERENCE TO RELATED APPLICATIONS

This is a divisional application of U.S. application Ser. No. 13/935,228, filed on Jul. 3, 2013, which application claims the benefit of and priority to Chinese Patent Application No. CN201210349744.5 filed on Sep. 18, 2012 and entitled "Semiconductor Device and Manufacturing Method Thereof", each of which is incorporated herein by reference in their entireties.

BACKGROUND

1. Field of the Invention

The present invention relates to the field of semiconductor technology, and more particularly to a semiconductor device.

2. Description of the Related Art

By using embedded SiGe (eSiGe) processes to form source and drain regions of a PMOS (p-Channel Metal Oxide Semiconductor) device, a compressive stress can be applied to a channel region so as to increase carrier mobility of the PMOS device. Some eSiGe processes include forming a Sigma ("Σ") shaped recess in a silicon substrate and filling the Sigma-shaped recess with bulk SiGe, which can further increase the compressive stress applied to the channel region and improve performance of the PMOS device through increased carrier mobility.

FIGS. 1A to 1D show cross-section views of a semiconductor device at different stages of fabrication using an eSiGe process in the prior art.

As shown in FIG. 1A, the semiconductor device includes a substrate 100 and gates 102 formed on a surface of the substrate 100. The semiconductor device further includes sidewalls 103 formed on side surfaces of the gates 102, and a Sigma-shaped recess 101 formed in the substrate 100 between adjacent gates 102.

As shown in FIG. 1B, a SiGe seed layer 104 is formed on a surface of the Sigma-shaped recess 101.

As shown in FIG. 1C, bulk SiGe 105 (doped with boron) is formed on a surface of the SiGe seed layer 104, with the boron-doped bulk SiGe 105 filling the Sigma-shaped recess 101. As shown in FIG. 1D, a Si cap layer 106 is formed on surfaces of the SiGe seed layer 104 and boron-doped bulk SiGe 105, and located between opposite sidewalls 103 of adjacent gates 102.

In order to achieve high carrier mobility in a PMOS device, a high concentration of Ge in the boron-doped bulk SiGe 105 may be necessary. However, a high concentration of Ge can impede boron atoms in the boron-doped bulk SiGe 105 from diffusing, which may subsequently result in portions of the SiGe seed layer 104 that are deficient in boron (see, e.g. elliptical regions 41 of FIG. 4). These boron-deficient regions can result in high external resistance, thereby impacting semiconductor device performance.

The table below shows an example of the relationship between Ge concentration (in %) and external resistance $R_{ex}$ (in ohms) for a particular PMOS device in the prior art.

| Ge concentration | 18% | 25% |
|---|---|---|
| $R_{ex}$ | 366 ohms | 3022 ohms |

As shown in the above table, when the concentration of Ge increases from 18% to 25%, $R_{ex}$ may increase by an order of magnitude from 366 ohms to 3022 ohms. The large increase in external resistance $R_{ex}$ may subsequently result in degradation of semiconductor device performance.

SUMMARY

The present disclosure is directed to address at least the above problem relating to high external resistance (boron-deficient regions) in a semiconductor device.

According to some embodiments of the inventive concept, a method of fabricating a semiconductor device is provided. The method includes forming a plurality of gates on a surface of a substrate, forming sidewalls onside surfaces of the gates, forming a Sigma-shaped recess in the substrate between adjacent gates, forming a SiGe seed layer on an inner surface of the Sigma-shaped recess, forming bulk SiGe doped with boron on a surface of the SiGe seed layer, and filling the Sigma-shaped recess with the boron-doped bulk SiGe, forming a first recess by etching a portion of the SiGe seed layer and the boron-doped bulk SiGe in the Sigma-shaped recess, and forming a SiGe regeneration layer in the first recess beneath the surface of the substrate, wherein the SiGe regeneration layer is doped with boron, and the boron-doped SiGe regeneration layer has a higher concentration of boron than the SiGe seed layer or the boron-doped bulk SiGe.

In some embodiments, the method may include forming an epitaxial Si cap layer on a surface of the boron-doped SiGe regeneration layer between opposite sidewalls of adjacent gates.

In some embodiments, forming the first recess by etching the portion of the SiGe seed layer and boron-doped bulk SiGe in the Sigma-shaped recess may include etching the SiGe seed layer and the boron-doped bulk SiGe using HCL (Hydrogen Chloride) with an epitaxial growth system.

In some embodiments, the boron-doped SiGe regeneration layer may have a depth of about 50 Å to 100 Å.

In some embodiments, the concentration of boron in the boron-doped SiGe regeneration layer may range from about $1 \times 10^{19}$ cm$^{-3}$ to $1 \times 10^{21}$ cm$^{-3}$.

In some embodiments, a concentration of Ge in the boron-doped SiGe regeneration layer may range from about 20% to 35%.

In some embodiments, the boron-doped SiGe regeneration layer may be epitaxially grown via an RPCVD (Reduced Pressure Chemical Vapor Deposition) process using gases comprising SiH$_4$, DCS, GeH$_4$, HCl, B$_2$H$_6$, or H$_2$, at a temperature of about 500° C. to 800° C. and a pressure of about 5 Torr to 25 Torr.

In some embodiments, the SiGe seed layer may be doped with boron atoms that diffused from the boron-doped bulk SiGe into the SiGe seed layer.

According to some other embodiments of the inventive concept, a semiconductor device is provided. The semiconductor device includes a plurality of gates formed on a surface of a substrate, a plurality of sidewalls formed on side surfaces of the gates, a Sigma-shaped recess formed in the substrate between adjacent gates, a SiGe seed layer formed on an inner surface of the Sigma-shaped recess, boron-doped bulk SiGe formed on a surface of the SiGe seed layer with the boron-doped bulk SiGe filling the Sigma-shaped recess, and a boron-doped SiGe regeneration layer formed in a first recess beneath the surface of the substrate, wherein the first recess is formed by etching a portion of the SiGe seed layer and the boron-doped bulk SiGe in the Sigma-shaped recess, and the boron-doped SiGe regeneration layer has a higher concentration of boron than the SiGe seed layer or the boron-doped bulk SiGe.

In some embodiments, the concentration of boron in the boron-doped SiGe regeneration layer may range from about $1\times10^{19}$ cm$^{-3}$ to $1\times10^{21}$ cm$^{-3}$.

In some embodiments, the boron-doped SiGe regeneration layer may have a depth of about 50 Å to 100 Å.

In some embodiments, a concentration of Ge in the boron-doped SiGe regeneration layer may range from about 20% to 35%.

In some embodiments, the semiconductor device may include a Si cap layer epitaxially grown on a surface of the boron-doped SiGe regeneration layer.

In some embodiments, the first recess may be formed by etching a portion of the SiGe seed layer and the boron-doped bulk SiGe in the Sigma-shaped recess using HCL (Hydrogen Chloride) with an epitaxial growth system.

In some embodiments, the boron-doped SiGe regeneration layer may be epitaxially grown via an RPCVD (Reduced Pressure Chemical Vapor Deposition) process using gases comprising SiH$_4$, DCS, GeH$_4$, HCl, B$_2$H$_6$, or H$_2$, at a temperature of about 500° C. to 800° C. and a pressure of about 5 Torr to 25 Torr.

In some embodiments, the SiGe seed layer may be doped with boron atoms that diffused from the boron-doped bulk SiGe into the SiGe seed layer.

Further features of the disclosure will be apparent based on the following detailed description of various embodiments with reference to the accompanying drawings.

BRIEF DESCRIPTION OF THE DRAWINGS

The accompanying drawings, which are incorporated herein and constitute a part of the specification, illustrate different embodiments of the inventive concept and, together with the description, serve to more clearly describe the different embodiments.

DESCRIPTION OF THE EMBODIMENTS

Figure 1A:
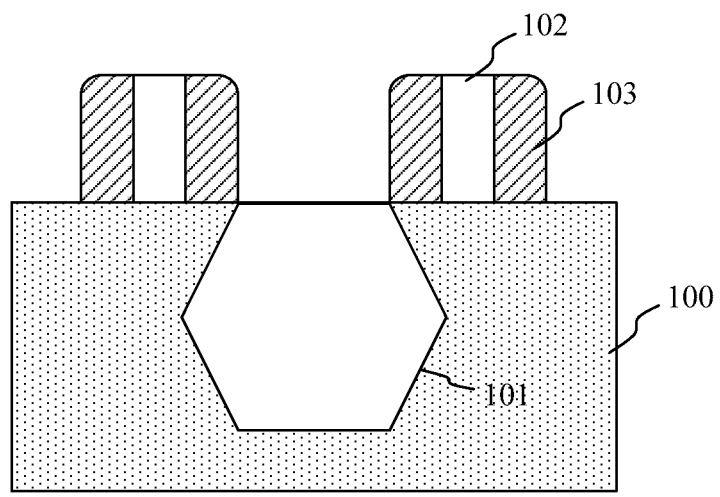
FIGS. 1A to 1D show cross-section views of a semiconductor device at different stages of fabrication using an eSiGe process in the prior art.
Figure 1B:
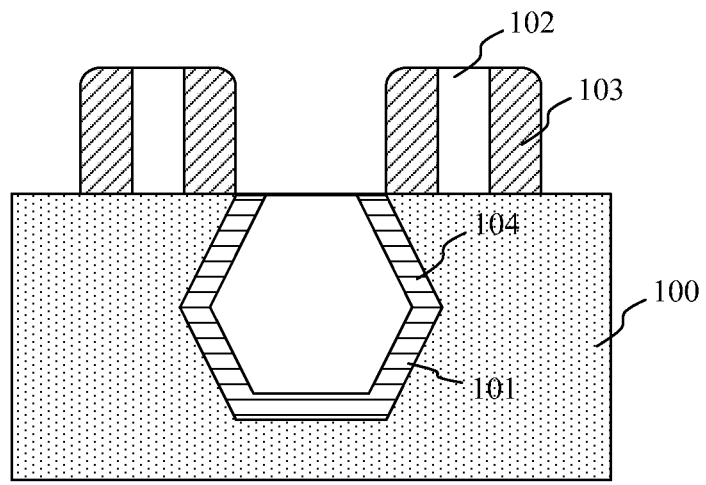
Figure 1C:
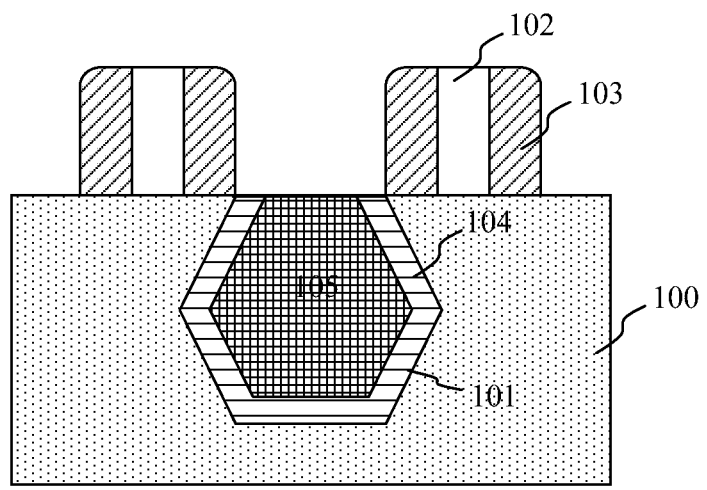

Various embodiments of the inventive concept are next described in detail with reference to the drawings. Common reference numerals and letters in the drawings refer to the same or similar parts. Also, the parts shown in the drawings may not be necessarily drawn to scale.

It is noted that the relative arrangement of the components and steps, and the numerical expressions and values set forth in these embodiments do not limit the scope of the inventive concept unless specifically stated otherwise.

Techniques, methods, and apparatus as known by one of ordinary skill in the art, although omitted in some instances, are intended to be part of the specification where appropriate.

In the embodiments illustrated and described herein, any specific value pertaining to a part should be interpreted as illustrative and non-limiting. For example, parts in other embodiments may have different values.

The following description of the different embodiments is merely illustrative in nature and is not intended to limit the inventive concept, its application, or use.

In the present disclosure, the term "semiconductor device" refers to a device having one or more semiconductor materials. The device may include a manufactured semiconductor device product and/or an intermediate semiconductor device product formed during a manufacturing or machining process.

Below, a semiconductor device and method of fabricating the semiconductor device according to an embodiment of the inventive concept will be described with reference to FIGS. 2A to 2C.

Figure 2A:
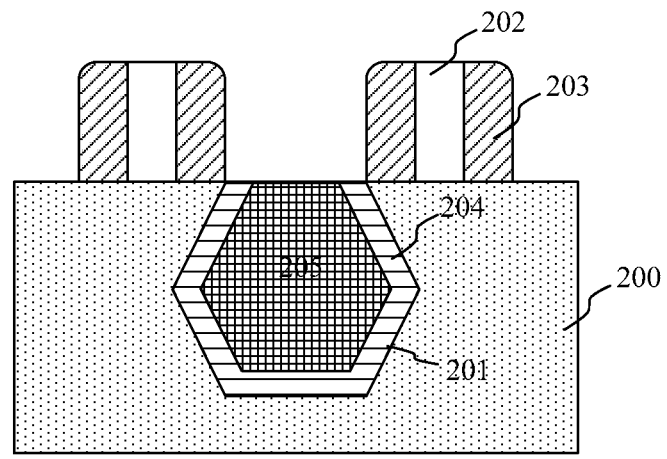
FIGS. 2A to 2C show cross-section views of a semiconductor device at different stages of fabrication according to an embodiment of the inventive concept.

Referring to FIG. 2A, a substrate 200 (for example, a silicon substrate) is provided. Gates 202 are formed on a surface of the substrate 200, and sidewalls 203 are formed on side surfaces of the gates 202. A Sigma-shaped recess 201 is formed in the substrate 200 between adjacent gates 202. A SiGe seed layer 204 is formed on an inner surface of the Sigma-shaped recess 201. Bulk SiGe 205 is formed on a surface of the SiGe seed layer 204, with the bulk SiGe 205 filling the Sigma-shaped recess 201. In some embodiments, the SiGe seed layer 204 and/or the bulk SiGe 205 may be epitaxially grown. In some embodiments, the bulk SiGe 205 may be doped with boron.

In some embodiments, the SiGe seed layer 204 may be doped with a trace amount of boron during epitaxial growth of the SiGe seed layer 204. In other embodiments, boron atoms from a boron-doped bulk SiGe 205 may diffuse into the SiGe seed layer 204 (which may be either doped or undoped).

Figure 2B:
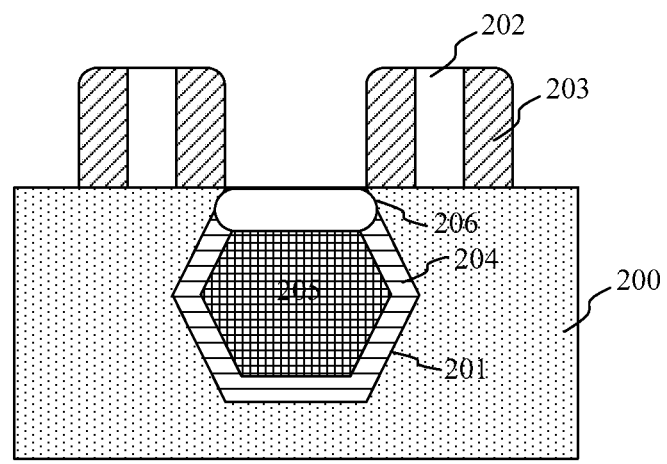

Referring to FIG. 2B, a recess 206 is formed by etching a portion of the SiGe seed layer 204 and bulk SiGe 205 in the Sigma-shaped recess 201. The recess 206 may be formed, for example, using known etching methods such as anisotropic dry etching or wet etching. In some embodiments, the recess 206 may have a depth of about 50~100 Å.

Figure 2C:
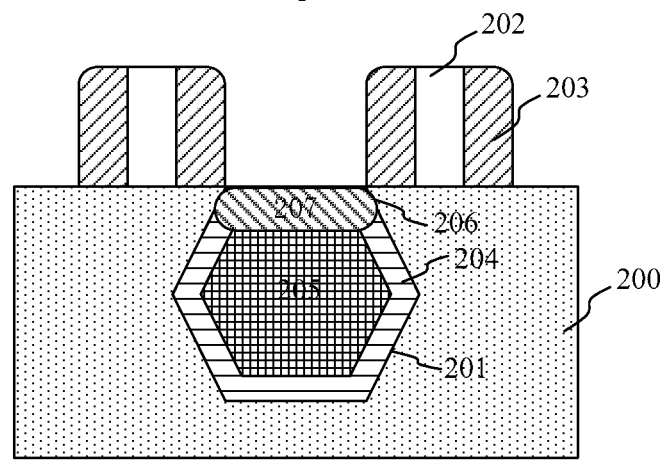

Referring to FIG. 2C, a SiGe regeneration layer 207 is formed in the recess 206 beneath the surface of the substrate 200. In some embodiments, the SiGe regeneration layer 207 may be epitaxially grown. In some embodiments, the SiGe regeneration layer 207 may be doped with boron. In some embodiments, the concentration of boron in a boron-doped SiGe regeneration layer 207 may be higher than the concentration of boron in the SiGe seed layer 204. As previously described, boron may be present in a SiGe seed layer 204 as a result of doping the SiGe seed layer 204 during epitaxial growth of the SiGe seed layer 204, or as a result of boron atoms diffusing from a boron-doped bulk SiGe 205 into the SiGe seed layer 204.

In some embodiments, the concentration of boron in the SiGe regeneration layer 207 may range from about $1\times10^{19}$ to $1\times10^{21}$ cm$^{-3}$. In some embodiments, the concentration of Ge in the SiGe regeneration layer 207 may range from about 20% to 35%.

In some embodiments, a boron-doped SiGe regeneration layer 207 may have a higher concentration of boron than the SiGe seed layer 204 and/or a boron-doped bulk SiGe 205. In other words, the boron-doped SiGe regeneration layer 207 is rich in boron and has a lower concentration of Ge compared to the SiGe seed layer 204 and/or the boron-doped bulk SiGe 205. Subsequently, boron atoms in the boron-doped SiGe regeneration layer 207 can diffuse more easily, for example, to (any) surrounding areas that may be deficient in boron. As a result, the external resistance of the semiconductor device can be reduced, and performance of the semiconductor device can be improved.

Next, a semiconductor device and method of fabricating the semiconductor device according to another embodiment of the inventive concept will be described with reference to FIGS. 3A to 3F.

Figure 3A:
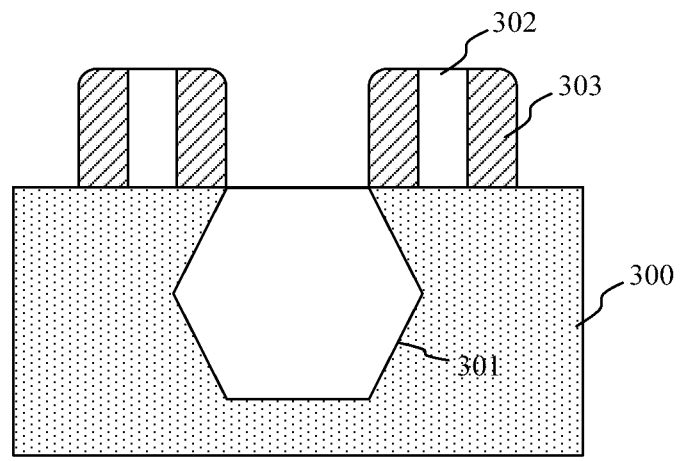
FIGS. 3A to 3F show cross-section views of a semiconductor device at different stages of fabrication according to another embodiment of the inventive concept.

Referring to FIG. 3A, a substrate 300 (for example, a silicon substrate) is provided. Gates 302 are formed on a surface of the substrate 300, and sidewalls 303 are formed on side surfaces of the gates 302. A Sigma-shaped recess 301 is formed in the substrate 300 between adjacent gates 302. The Sigma-shaped recess 301 may be formed by etching the substrate 300, for example, using known etching methods such as anisotropic dry etching or wet etching.

Figure 3B:
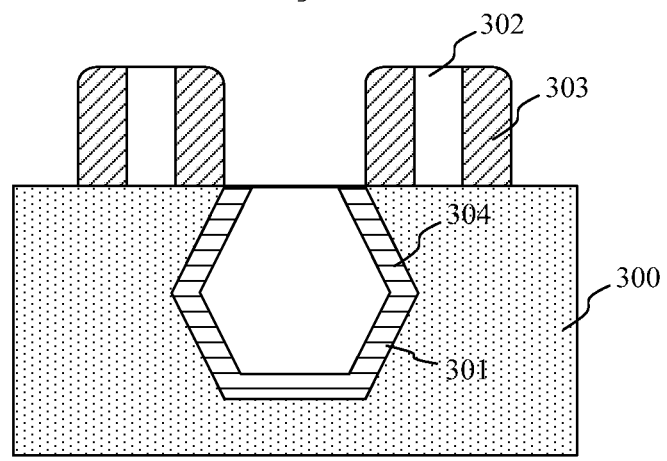

As shown in FIG. 3B, a SiGe seed layer 304 is formed on an inner surface of the Sigma-shaped recess 301. In some embodiments, the SiGe seed layer 304 may be epitaxially grown. In some embodiments, the SiGe seed layer 304 may be doped with a trace amount of boron during epitaxial growth of the SiGe seed layer 304.

Figure 3C:
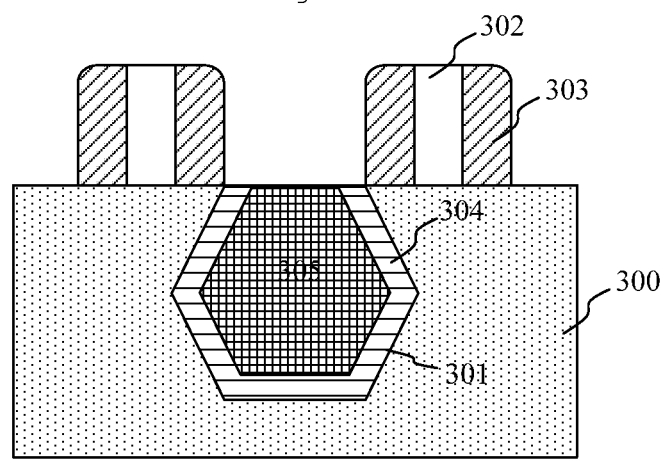

As shown in FIG. 3C, bulk SiGe 305 is formed on a surface of the SiGe seed layer 304, with the bulk SiGe 305 filling the Sigma-shaped recess 301. In some embodiments, the bulk SiGe 305 may be epitaxially grown. In some embodiments, the bulk SiGe 305 may be doped with boron. In some embodiments, boron atoms from a boron-doped bulk SiGe 305 may diffuse into the SiGe seed layer 304 (which may be either doped or undoped).

Figure 3D:
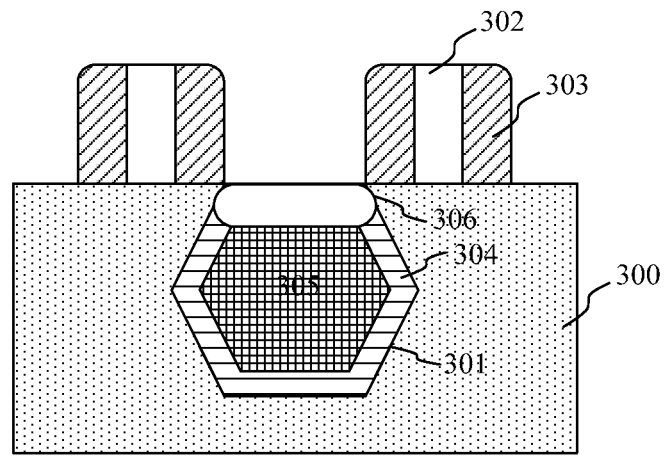

As shown in FIG. 3D, a recess 306 is formed by etching a portion of the SiGe seed layer 304 and bulk SiGe 305 in the Sigma-shaped recess 301. The recess 306 may be formed, for example, using known etching methods such as anisotropic dry etching or wet etching. In some embodiments, the recess 306 may have a depth of about 50~100 Å.

Figure 3E:
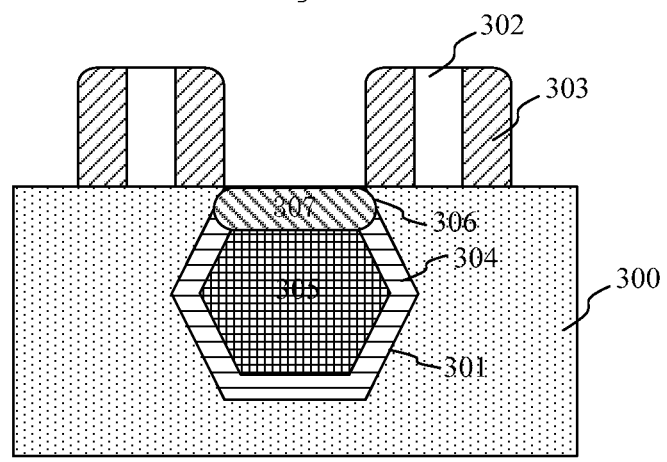

As shown in FIG. 3E, a SiGe regeneration layer 307 is formed in the recess 306 beneath the surface of the substrate 300. In some embodiments, the SiGe regeneration layer 307 may be epitaxially grown, for example, via an RPCVD (Reduced Pressure Chemical Vapor Deposition) epitaxial process using gases such as $SiH_4$, DCS, $GeH_4$, $HC_1$, $B_2H_6$, or $H_2$, at a temperature of about 500° C. to 800° C. and pressure of about 5 Torr to 25 Torr.

In some embodiments, the SiGe regeneration layer 307 may be doped with boron. In some embodiments, the concentration of boron in a boron-doped SiGe regeneration layer 307 may be higher than the concentration of boron in the SiGe seed layer 304. As previously described, boron may be present in the SiGe seed layer 304 as a result of doping the SiGe seed layer 304 with boron during epitaxial growth of the SiGe seed layer 304, or as a result of boron atoms diffusing from a boron-doped bulk SiGe 305 into the SiGe seed layer 304.

In some embodiments, the concentration of boron in the SiGe regeneration layer 307 may range from about $1 \times 10^{19}$ to $1 \times 10^{21}$ $cm^{-3}$. In some embodiments, the concentration of Ge in the SiGe regeneration layer 307 may range from about 20% to 35%.

Figure 3F:
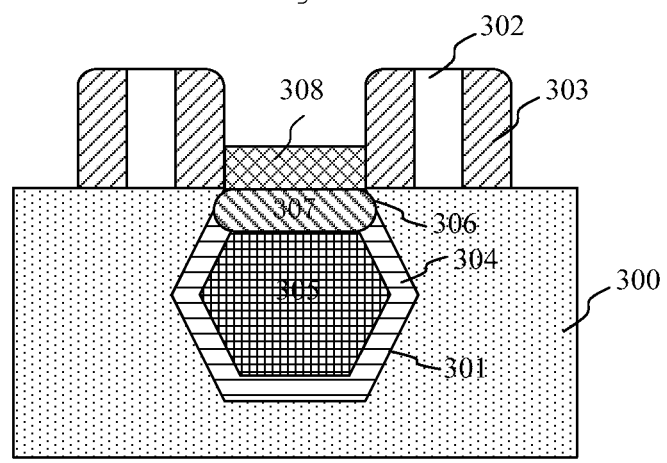

As shown in FIG. 3F, a cap layer 308 is formed on a surface of the SiGe regeneration layer 307 between opposite sidewalls 303 of adjacent gates 302. In some embodiments, the cap layer 306 may be epitaxially grown. In some embodiments, the cap layer 306 may be formed of Si.

In some embodiments, a boron-doped SiGe regeneration layer 307 may have a higher concentration of boron than the SiGe seed layer 304 and/or a boron-doped bulk SiGe 305. In other words, the boron-doped SiGe regeneration layer 307 is rich in boron and has a lower concentration of Ge compared to the SiGe seed layer 304 and/or the boron-doped bulk SiGe 305. Subsequently, boron atoms in the boron-doped SiGe regeneration layer 307 can diffuse more easily, for example, to (any) surrounding areas that may be deficient in boron. As a result, the external resistance of the semiconductor device can be reduced, and performance of the semiconductor device can be improved.

Figure 1D:
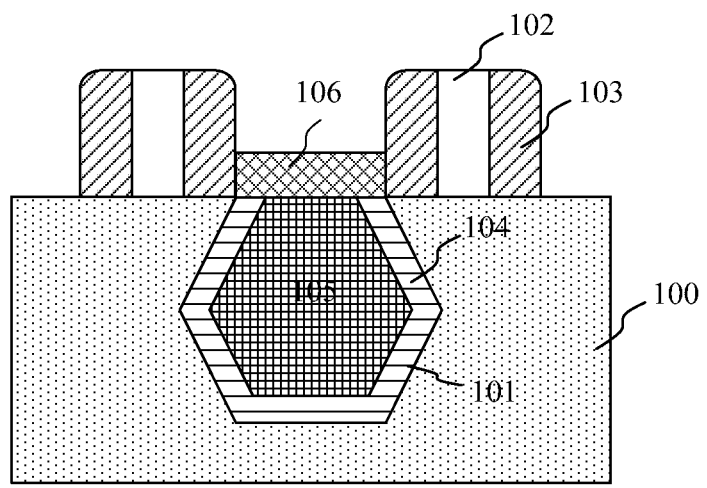
Figure 4:
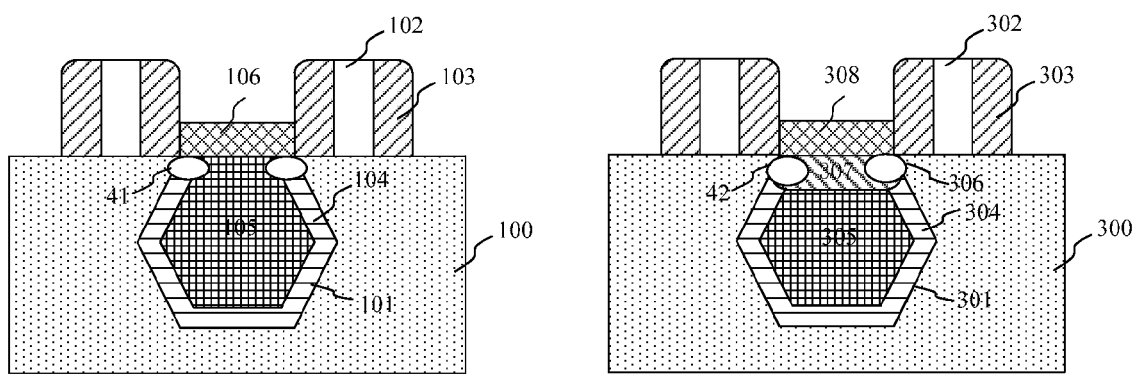
FIG. 4 shows a side-by-side comparison of the cross-section views of a semiconductor device in the prior art and a semiconductor device according to an embodiment of the inventive concept.

Next, FIG. 4 shows a side-by-side comparison of the cross-section views of a semiconductor device in the prior art and a semiconductor device according to an embodiment of the inventive concept. For example, the cross-section view on the left of FIG. 4 may correspond to the semiconductor device of FIG. 1D, while the cross-section view on the right of FIG. 4 may correspond to the semiconductor device of FIG. 3F.

Reference may be made to the previous description of the semiconductor device in the prior art (FIGS. 1A to 1D) for the materials contained in the semiconductor device and the formation method thereof.

Referring to the semiconductor device on the right of FIG. 4, the semiconductor device includes gates 302 formed on a surface of a substrate 300, and sidewalls 303 formed on side surfaces of the gates 302. A Sigma-shaped recess 301 is formed in the substrate 300 between adjacent gates 302. A SiGe seed layer 304 is formed on an inner surface of the Sigma-shaped recess 301. Bulk SiGe 305 (doped with boron) is formed on a surface of the SiGe seed layer 304, with the boron-doped bulk SiGe 305 filling the Sigma-shaped recess 301. The SiGe seed layer 304 includes boron atoms diffused from the boron-doped bulk SiGe 305 into the SiGe seed layer 304. A recess 306 is formed by etching a portion of the SiGe seed layer 304 and boron-doped bulk SiGe 305 in the Sigma-shaped recess 301. A SiGe regeneration layer 307 (doped with boron) is formed in the recess 306 beneath the surface of the substrate, with the SiGe regeneration layer 307 having a higher concentration of boron than the SiGe seed layer 304 and/or the boron-doped bulk SiGe 305. A Si cap layer 308 is formed on the SiGe regeneration layer 307 between opposite sidewalls 303 of adjacent gates 302.

Referring to the prior art semiconductor device on the left of FIG. 4, the upper portions of the boron-doped bulk SiGe 105 may have higher percentages of Ge compared to the lower portions of the boron-doped bulk SiGe 105. As previously described, a high concentration of Ge can impede diffusion of boron atoms from the boron-doped bulk SiGe 105 into the SiGe seed layer 104. As a result, areas of high electrical resistance (denoted by elliptical regions 41) may be formed in the portions of the SiGe seed layer 104 that are deficient in boron. As previously described with reference to FIGS. 1A to 1D, these areas of high electrical resistance (e.g., regions 41) may lead to degradation of transistor performance.

Next, referring to the semiconductor device on the right of FIG. 4, the semiconductor device may initially include areas of high electrical resistance (denoted by elliptical regions 42) formed in the portions of the SiGe seed layer 304 that are deficient in boron. However, the high-resistance areas 42 are etched during formation of the recess 306, and the SiGe regeneration layer 307 (having a higher concentration of boron than the SiGe seed layer 304 and/or the boron-doped bulk SiGe 305) is formed in the recess 306. Thus, the high-resistance areas (e.g., regions 42) are removed, and replaced by the SiGe regeneration layer 307 which is rich in boron and has low electrical resistance. As a result, a lower $R_{ex}$ (external resistance) value can be obtained in the semiconductor device on the right of FIG. 4, unlike the prior art semiconductor device on the left which has a relatively higher $R_{ex}$.

In some embodiments of the inventive concept, low $R_{ex}$ values may be obtained in the semiconductor device regardless of the percentage of Ge (or concentration of Ge) in the boron-doped bulk SiGe 305 or SiGe seed layer 304.

Examples of semiconductor devices and methods of fabricating the semiconductor device according to different embodiments of the inventive concept have been described in detail in the foregoing description. Details well-known to those of ordinary skill in the art have not been described so as to avoid obscuring the concept of this disclosure. Nevertheless, those skilled in the art would understand how to implement the disclosed technical solutions based on the above detailed description.

Although embodiments of the present disclosure have been demonstrated in detail, those skilled in the art would understand that the disclosed embodiments are only intended to be illustrative without limiting the scope of the present disclosure, and that the above embodiments can be modified without departing from the scope and spirit of the present disclosure.

What is claimed is:

1. A semiconductor device, comprising:
   a plurality of gates formed on a surface of a substrate;
   a plurality of sidewalls formed on side surfaces of the gates;
   a Sigma-shaped recess formed in the substrate between adjacent gates;
   a SiGe seed layer formed on an inner surface of the Sigma-shaped recess;
   boron-doped bulk SiGe formed on a surface of the SiGe seed layer, with the boron-doped bulk SiGe filling the Sigma-shaped recess; and
   a boron-doped SiGe regeneration layer formed in a first recess beneath the surface of the substrate,
   wherein the first recess is formed by etching a portion of the SiGe seed layer and the boron-doped bulk SiGe in the Sigma-shaped recess, and the boron-doped SiGe regeneration layer has a higher concentration of boron than the SiGe seed layer or the boron-doped bulk SiGe.

2. The semiconductor device according to claim 1, wherein the concentration of boron in the boron-doped SiGe regeneration layer ranges from about $1 \times 10^{19}$ cm$^{-3}$ to $1 \times 10^{21}$ cm$^{-3}$.

3. The semiconductor device according to claim 2, wherein the boron-doped SiGe regeneration layer has a depth of about 50 Å to 100 Å.

4. The semiconductor device according to claim 3, wherein a concentration of Ge in the boron-doped SiGe regeneration layer ranges from about 20% to 35%.

5. The semiconductor device according to claim 4, wherein the SiGe seed layer is doped with boron atoms that diffused from the boron-doped bulk SiGe into the SiGe seed layer.

6. The semiconductor device according to claim 2, wherein a concentration of Ge in the boron-doped SiGe regeneration layer ranges from about 20% to 35%.

7. The semiconductor device according to claim 3, wherein the SiGe seed layer is doped with boron atoms that diffused from the boron-doped bulk SiGe into the SiGe seed layer.

8. The semiconductor device according to claim 2, wherein the SiGe seed layer is doped with boron atoms that diffused from the boron-doped bulk SiGe into the SiGe seed layer.

9. The semiconductor device according to claim 1, wherein the boron-doped SiGe regeneration layer has a depth of about 50 Å to 100 Å.

10. The semiconductor device according to claim 9, wherein a concentration of Ge in the boron-doped SiGe regeneration layer ranges from about 20% to 35%.

11. The semiconductor device according to claim 10, wherein the SiGe seed layer is doped with boron atoms that diffused from the boron-doped bulk SiGe into the SiGe seed layer.

12. The semiconductor device according to claim 9, wherein the SiGe seed layer is doped with boron atoms that diffused from the boron-doped bulk SiGe into the SiGe seed layer.

13. The semiconductor device according to claim 1, wherein a concentration of Ge in the boron-doped SiGe regeneration layer ranges from about 20% to 35%.

14. The semiconductor device according to claim 13, wherein the SiGe seed layer is doped with boron atoms that diffused from the boron-doped bulk SiGe into the SiGe seed layer.

15. The semiconductor device according to claim 1, wherein the SiGe seed layer is doped with boron atoms that diffused from the boron-doped bulk SiGe into the SiGe seed layer.

16. The semiconductor device according to claim 1, further comprising a Si cap layer epitaxially grown on a surface of the boron-doped SiGe regeneration layer.

17. The semiconductor device according to claim 16, wherein the first recess is formed by etching a portion of the SiGe seed layer and the boron-doped bulk SiGe in the Sigma-shaped recess using HCL (Hydrogen Chloride) with an epitaxial growth system.

18. The semiconductor device according to claim 17, wherein the boron-doped SiGe regeneration layer is epitaxially grown via an RPCVD (Reduced Pressure Chemical Vapor Deposition) process using gases comprising SiH4, DCS, GeH4, HCl, B2H6, or H2, at a temperature of about 500° C. to 800° C. and a pressure of about 5 Torr to 25 Torr.

19. The semiconductor device according to claim 1, wherein the first recess is formed by etching a portion of the SiGe seed layer and the boron-doped bulk SiGe in the Sigma-shaped recess using HCL (Hydrogen Chloride) with an epitaxial growth system.

20. The semiconductor device according to claim 1, wherein the boron-doped SiGe regeneration layer is epitaxially grown via an RPCVD (Reduced Pressure Chemical Vapor Deposition) process using gases comprising SiH4, DCS, GeH4, HCl, B2H6, or H2, at a temperature of about 500° C. to 800° C. and a pressure of about 5 Torr to 25 Torr.

* * * * *